United States Patent [19]
Fuse

[11] Patent Number: 5,343,083
[45] Date of Patent: Aug. 30, 1994

[54] ANALOG/DIGITAL HYBRID MASTERSLICE IC

[75] Inventor: Mamoru Fuse, Tokyo, Japan

[73] Assignee: NEC Corporation, Tokyo, Japan

[21] Appl. No.: 12,736

[22] Filed: Feb. 3, 1993

[30] Foreign Application Priority Data

Feb. 3, 1992 [JP] Japan .................................. 4-017399

[51] Int. Cl.[5] .............................................. H03K 7/56
[52] U.S. Cl. .................... 307/242; 307/498; 307/475; 364/602
[58] Field of Search ............... 307/242, 570, 490, 498, 307/499, 231, 465, 475; 364/600, 602

[56] References Cited

FOREIGN PATENT DOCUMENTS 0052640 4/1980 Japan ................................. 307/475
0140923 7/1985 Japan ................................. 307/475

Primary Examiner—James B. Mullins
Assistant Examiner—Jim Dudek
Attorney, Agent, or Firm—Sughrue, Mion, Zinn, Macpeak & Seas

[57] ABSTRACT

An analog/digital hybrid masterslice IC includes an analog circuit section formed by a CMOS analog section and an analog master section in which a plurality of basic blocks are arranged in array form, and a digital circuit section formed by a gate array section. The digital circuit section operates under a power source voltage lower than that supplied to the analog circuit section. The IC further includes a selector circuit disposed between the digital circuit section and the analog circuit section, for testing the analog circuit section and the digital circuit section independently from each other, and a level shift circuit disposed between the selector circuit and the analog master section, for amplifying an output level from the gate array section. The level shift circuit is fixedly built-in in a masterwafer substrate as a hard-macro. The arrangement ensures that there is no possibility of any digital noise entering the analog circuit.

5 Claims, 3 Drawing Sheets

ANALOG/DIGITAL HYBRID MASTERSLICE IC

BACKGROUND OF THE INVENTION

1. Field of the Invention

The present invention relates to an analog/digital hybrid masterslice integrated circuit, and more particularly to a Bi-CMOS analog/digital hybrid IC with a level-shift circuit fixedly built-in in a masterwafer substrate as a hard-macro block.

2. Description of the Related Art

Recently, analog/digital hybrid masterslice ICs to which the present invention relates have become more advanced as it has become possible to integrate on the same chip various large scale high precision analog circuits and large scale digital logic circuits in accordance with the advancement of a Bi-CMOS process. Conventionally, a method for developing analog/digital hybrid LSIs whereby an analog circuit is designed by hand, a digital circuit is designed using a cell base method and both are then integrated onto the same chip has been widely adopted. However, although this method allows variations in designs, the development period is fairly long and the development cost inevitably becomes expensive.

As a method intended to compensate for the above weak points in analog/digital hybrid LSIs, there has been proposed and developed a so-called fixed substrate type analog/digital hybrid masterwafer method of the kind to which the present invention relates. In that method an analog master section formed by arranging electronic components such as transistors, resistors and capacitors in array form and a gate array (G/A) section are constructed on the same chip. This has considerably improved both the development period and the development cost.

The CMOS logic section usually adopts a power supply voltage of 5 V. On the other hand, for the bipolar circuits and the CMOS analog circuits, power supply voltages of above 5 V, for example, 5 V, 9 V, 12 V are widely used.

If the cell base method is used, a well designed circuit can be attained by selecting a suitable process fitted to the power supply voltage and by adjusting the device parameters. However, there is a great design restriction in the fixed substrate type masterwafer. For example, if the power supply voltage for the bipolar analog circuit is 10 V and a MOS transistor is used to control the base current of an NPN bipolar transistor, a 5 $V_{Peak-Peak}$ pulse signal generated in the MOS logic circuit as it is will not be sufficient to drive the MOS transistor, and it will be necessary to increase the amplitude thereof to 10 $V_{P-P}$ in order to drive the transistor. To this end, a level conversion circuit is assumed to be constructed by bipolar elements, the 5 $V_{P-P}$ control signal generated in the MOS logic circuit is increased by the bipolar device to a voltage of 10 $V_{P-P}$, and can then turn-ON and -OFF the MOS transistors arranged at both ends of the bipolar device. Furthermore, it is then returned to the bipolar analog circuit section. Accordingly, as there is a high voltage pulse signal including higher harmonics going backwards and forwards right above the analog circuit section, this will be a cause for the digital signal to be mixed into the analog circuit as noise.

SUMMARY OF THE INVENTION

It is, therefore, an object of the invention to overcome the problems existing in the conventional arrangements and to provide an improved analog/digital hybrid masterslice IC, especially that of a Bi-CMOS fixed substrate type with a built-in level shift circuit.

According to one aspect of the invention, there is provided an analog/digital hybrid masterslice IC comprising:

an analog master section in which basic blocks each having a cell formed by a bipolar device and having a MOS transistor connected to the cell are arranged in array form;

a CMOS analog section which, together with the analog master section, constitutes an analog circuit section;

a gate array section which forms a digital circuit section and operates under a power source voltage lower than that supplied to the analog circuit section;

a selector circuit which is disposed between the digital circuit section and the analog circuit section and operates for testing the analog circuit section and the digital circuit section independently from each other; and a level shift circuit which amplifies a level of an output signal from the digital circuit section, the level shift circuit being disposed between the selector circuit and the analog circuit section and fixedly built-in in a masterwafer substrate as a hard-macro.

The analog/digital hybrid masterslice IC according to the invention is one in which the power supply voltage supplied to the analog circuit section is higher than that supplied to the digital logic circuit section and the level shift circuits are built-in along the signal path from the digital logic circuit section to the analog circuit section. The arrangement ensures that there is no possibility of any digital noise entering the analog circuit section.

BRIEF DESCRIPTION OF THE DRAWINGS

The above and other objects, features and advantages of the present invention will be apparent from the following description of a preferred embodiment of the invention explained with reference to the accompanying drawings, in which.

PREFERRED EMBODIMENT OF THE INVENTION

Figure 1:
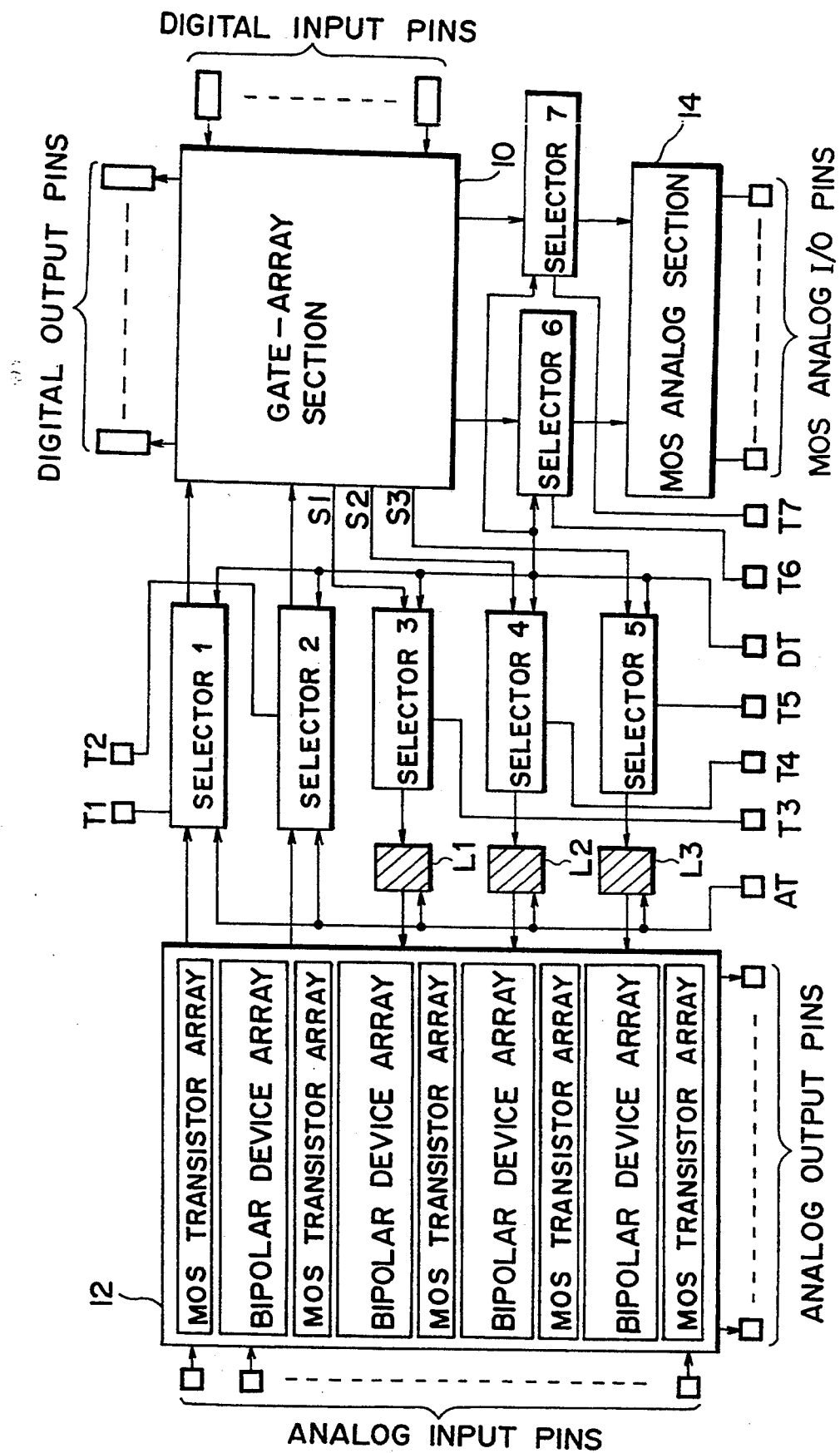
FIG. 1 is a conceptual diagram of an analog/digital hybrid masterslice IC having a built-in level shift circuit according to the invention.

Now, the present invention is explained with reference to the accompanying drawings. FIG. 1 is a conceptual diagram of an analog/digital hybrid masterslice IC having a built-in level shift circuit according to the invention. As shown in FIG. 1, there are seven (7) lines interconnecting an analog circuit section and a digital circuit section, out of which three (3) lines are control signal lines S1–S3 forwarding the signals from a gate array (G/A) section 10 (digital logic circuit section) to an analog master section 12. The analog master section 12 is so arranged that a plurality of basic blocks each having a cell formed by a bipolar device such as a bipolar transistor, a resistor or a capacitor and having MOS transistors disposed at both ends of the cell are arranged in array form. Test mode setting terminals are indicated by references AT and DT. The mode is set to a normal mode when the test mode setting terminals AT and DT are both low, is set to an analog test mode when the test mode setting terminal AT is high but the other test mode setting terminal DT is low, and is set to a digital test mode when the terminal AT is low but the other terminal DT is high. Assuming here that the test mode setting terminals AT and DT are both low, the signals are transferred between the analog master section 12 and the G/A section 10 and between the G/A section and the MOS analog section 14 by selectors 1–7 and no signals are sent to the test terminals T1–T7 from the selectors 1–7. The MOS analog section 14 is formed by, for example, an analog switch or a multiplexer. Under this normal mode, the logic signals of 5 $V_{P\text{-}P}$ produced at the G/A section 10 are inputted to the selectors 3–5 through the control signal lines S1–S3, and the outputs therefrom are inputted to level shift circuits L1–L3, respectively. The level shift circuits L1–L3 amplify the signals of 5 $V_{P\text{-}P}$ to pulse signals of 10 $V_{P\text{-}P}$, and apply the amplified pulse signals of 10 $V_{P\text{-}P}$ to the gates of the MOS transistors in the analog master section 12.

Figure 2:
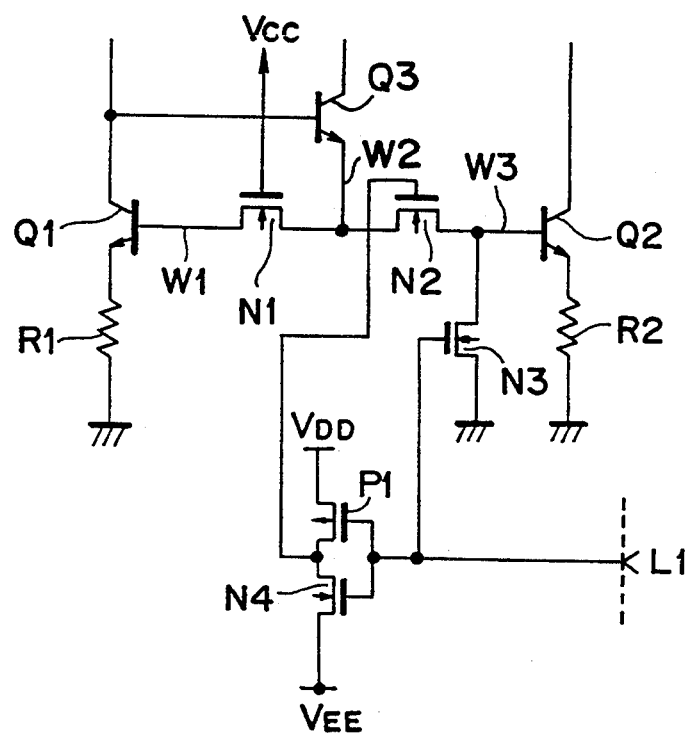
FIG. 2 is a circuit diagram showing an analog master section in the masterslice IC according to the invention.

FIG. 2 shows a circuit diagram of the analog master section 12. A bipolar transistor Q3 supplies a current to the bases of bipolar transistors Q1 and Q2. The transistor Q2 is turned-on and -off when an N-channel MOS transistor N2 is switched-on and -off. An N-channel MOS transistor N1 is a dummy transistor for compensating the ON-resistance of the transistor N2. An N-channel MOS transistor N3 operates to discharge to ground the charge accumulated in the base of the transistor Q2 when the transistor Q2 turns from ON to OFF, so that the transistor Q2 is turned OFF at a high speed. The signal inputted from the level shift circuit L1 drives the gate of the transistor N3 and, at the same time, drives the gates of the inverter constituted by a P-channel MOS transistor P1 and an N-channel MOS transistor N4. The power source voltages supplied to the inverter are set to $V_{DD}=10$ V and $V_{EE}=0$ V and, thus, the inverter outputs a pulse of 10 $V_{P\text{-}P}$. The outputs of the level shift circuit L1 and the inverter are both 10 $V_{P\text{-}P}$, so that it is possible to effect the ON/OFF control of the MOS transistors N2 and N3 with no reliance on the source/drain voltage of these transistors.

In the circuit shown as an example in FIG. 2, the N-channel transistors are used since the source/drain voltages are lower than $\frac{1}{2}$ $V_{CC}$. However, P-channel transistors are used when the source/drain voltages are higher than $\frac{1}{2}$ $V_{CC}$. In this case too, the outputs of the level shift circuit L1 and the inverter are capable of effecting the ON/OFF control of the P-channel transistors.

Figure 3:
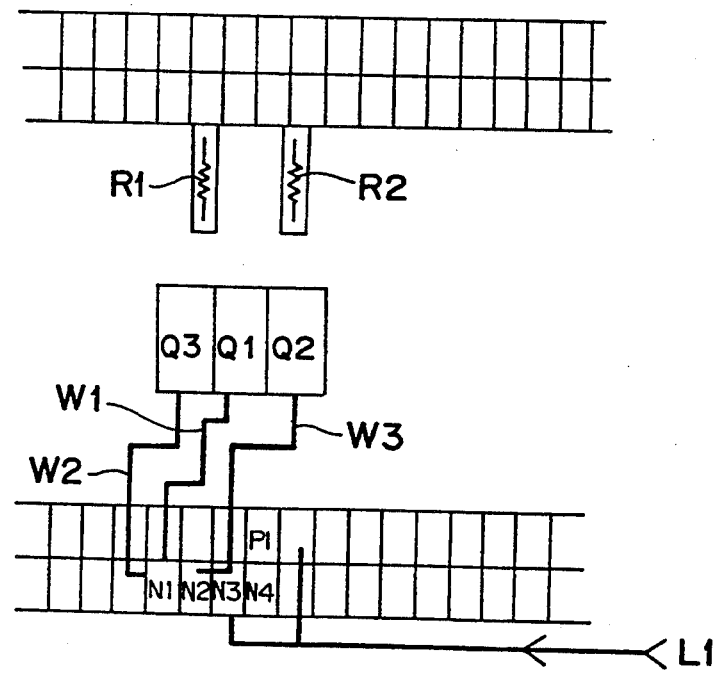
FIG. 3 is a layout diagram showing an arrangement wherein the circuit shown in FIG. 2 is laid-out on the masterwafer substrate.

FIG. 3 diagrammatically shows an arrangement in which the circuit shown in FIG. 2 is laid-out on a masterwafer and in which the output of the level shift circuit L1 inputted to the analog master section from its right hand is inputted both to the gates of the inverter constituted by the transistors P1 and N4 and to the gate of the transistor N3. There are three (3) signal lines W1–W3 interconnecting the MOS transistors N1–N3 and the bipolar transistors Q1–Q3. Of these three (3) lines, two (2) lines swing at 10 $V_{P\text{-}P}$ but, since the lines from the level shift circuit L1 to the transistors Q1, Q2 and Q3 are sufficiently separated from other devices operated by the analog circuit, there is no possibility for any digital noise to enter into the analog circuit thereby deteriorating the signal/noise (S/N) ratio of the analog circuit. The level shift circuits here are all amplifying circuits for amplifying the signal level from 5 $V_{P\text{-}P}$ to 10 $V_{P\text{-}P}$ and no level shift circuits for connecting the lines from the analog master circuit 12 to the G/A section 10 are disposed. This is based on the consideration that, when the digital output of the analog circuit 12 is to be converted into a CMOS level, the input specifications of the conversion circuit are generally diversified and cannot be regulated uniformly. Also, since the number of digital output lines from the analog circuit is smaller than that of the signal lines for controlling the analog circuit from the G/A section 10, it is easy for the circuit designer to design a circuit in which the output of the analog circuit block is converted to the CMOS level in order to establish a sufficient interface with respect to the G/A section 10.

Where the power source voltage supplied to the analog master section 12 is 5 v, the level shift circuits L1–L3 become unnecessary. Then, the signals of the signal lines S1–S3 pass through the signal lines L1–L3 and are inputted to the analog master section 12 through the selectors 3–5 thereby driving the gates of the MOS transistors concerned.

Figure 4:
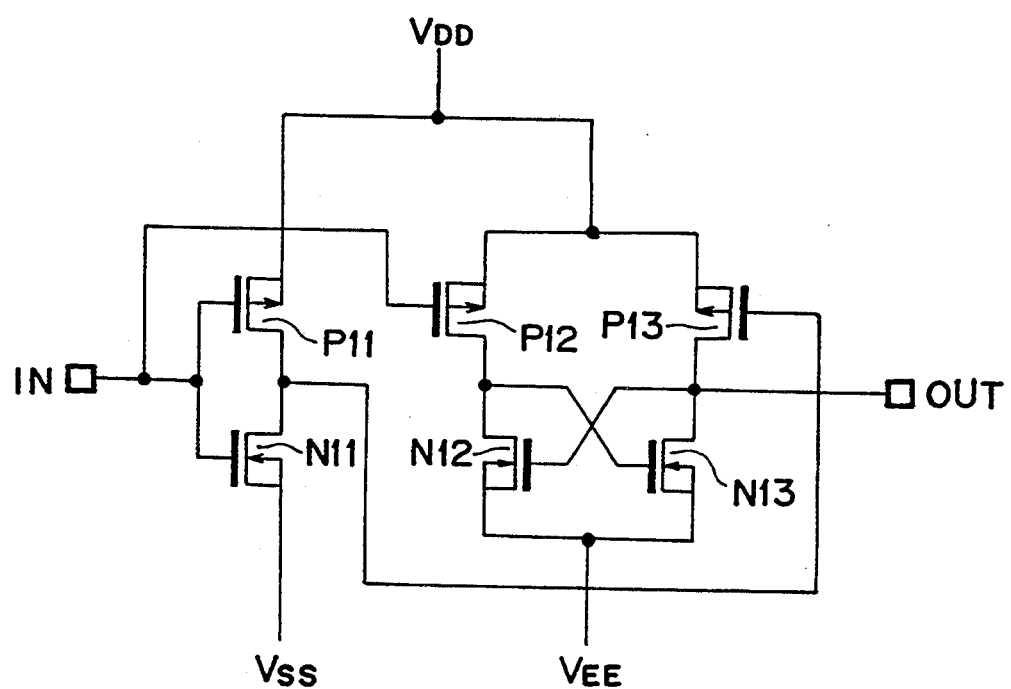
FIG. 4 is a circuit diagram showing an example of a level shift circuit used in the arrangement according to the invention.

FIG. 4 shows an example of the level shift circuit. This level shift circuit includes an inverter formed by a P-channel MOS transistor P11 and an N-channel MOS transistor N11; two P-channel MOS transistors P12 and P13 for switching operation; and cross-coupled N-channel MOS transistors N12 and N13. Now, assuming that the power source voltages $V_{DD}=5$ V, $V_{SS}=0$ V and $V_{EE}=-5$ V and that the pulse signal of 5 $V_{P\text{-}P}$ (5 V. 0 V) is inputted to the input terminal IN, there will be outputted at the output terminal OUT a signal of 10 $V_{P\text{-}P}$ which swings at $-5$ V and $+5$ V.

In the arrangements according to the invention, the level shift circuits which convert the digital signal of 5 $V_{P\text{-}P}$ to a digital signal of a higher amplitude level are built into the masterwafer as hard blocks between the analog master section and the selector section. This ensures that there is no possibility of any digital noise entering into the analog circuit thereby preventing the deterioration of the characteristics of the analog circuit. The control signals are inputted to the analog circuit through the selectors but, since the level shift circuits according to the invention are inserted in series in their signal lines, it is possible for the circuit designer to design a desired circuit without giving any special consideration to the existence of the level shift circuits, resulting in the reduction of the Turn Around Time (TAT) of circuit design and the prevention of errors in designing the circuit. Also, since the level shift circuits are independent from the analog master section, the specification as to the number of elements which can be used for the analog master section does not change regardless of whether the power source voltage supplied to the analog master section is 5 V, 9 V or 12 V or any combinations thereof, which means that the number of elements the user may use at the analog master section increases in substance. Furthermore, the level shift circuits can be made available as verified hard-macro assemblies and, by the testing in the analog test mode and in the digital test mode, the confirmation of operations and the checking of interconnections of the analog master section, the G/A internal circuits, the selector section, and the level shift circuits can be made independently from each other.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. An analog/digital hybrid masterslice IC comprising:

an analog master section in which basic blocks each having a cell formed by a bipolar device and having a MOS transistor connected to said cell are arranged in array form;

an analog section which, together with said analog master section, constitutes an analog circuit section;

a digital logic circuit section which operates under a power source voltage lower than that supplied to said analog circuit section;

a selector circuit which is disposed between said digital logic circuit section and said analog circuit section and operates for testing said analog circuit section and said digital logic circuit section independently from each other; and a level shift circuit which amplifies a level of an output signal from said digital logic circuit section, said level shift circuit being disposed between said selector circuit and said analog circuit section and fixedly built-in in a masterwafer substrate as a hardmacro.

2. An analog/digital hybrid masterslice IC according to claim 1, in which said level shift circuit is one which converts a digital signal of 5 $V_{P-P}$ to that of a higher level.

3. An analog/digital hybrid masterslice IC according to claim 1, in which said analog section is formed by a CMOS device.

4. An analog/digital hybrid masterslice IC according to claim 1, in which said digital logic circuit section is formed by a gate array.

5. An analog/digital hybrid masterslice IC according to claim 1, in which said level shift circuit includes: a first, a second and a third power supply terminal; a first P-channel MOS transistor having a drain, a source connected to said first power supply terminal, and a gate connected to an input terminal; a first N-channel MOS transistor having a drain connected to the drain of said first P-channel MOS transistor, a source connected to said second power supply terminal, and a gate connected to said input terminal, said first N-channel MOS transistor together with said first P-channel MOS tranistor constituting an inverter; a second P-channel MOS transistor having a drain, a source connected to said first power supply terminal, and a gate connected to said input terminal; a third P-channel MOS transistor having a source connected to said first power supply terminal, a gate connected to the drains of said first P-channel MOS transistor and first N-channel MOS transistor, and a drain connected to an output terminal; a second N-channel MOS transistor having a drain connected to the drain of said second P-channel MOS transistor, a gate connected to the drain of said third P-channel MOS transistor, and a source connected to said third power supply terminal; and a third N-channel MOS transistor having a drain connected to the drain of said third P-channel MOS transistor, a gate connected to the drain of said second P-channel MOS transistor, and a source connected to said third power supply terminal.

* * * * *